United States Patent
Zhang et al.

(10) Patent No.: US 8,836,553 B2
(45) Date of Patent: Sep. 16, 2014

(54) DSP RECIEVER WITH HIGH SPEED LOW BER ADC

(71) Applicant: Broadcom Corporation, Irvine, CA (US)

(72) Inventors: Bo Zhang, Irvine, CA (US); Ali Nazemi, Aliso Viejo, CA (US); Mahmoud Reza Ahmadi, Huntington Beach, CA (US); Afshin Momtaz, Laguna Hills, CA (US); Heng Zhang, Irvine, CA (US); Hassan Maarefi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/754,374

(22) Filed: Jan. 30, 2013

(65) Prior Publication Data

US 2014/0104086 A1    Apr. 17, 2014

Related U.S. Application Data

(60) Provisional application No. 61/746,018, filed on Dec. 26, 2012, provisional application No. 61/714,681, filed on Oct. 16, 2012.

(51) Int. Cl.
*H03M 1/10*    (2006.01)

(52) U.S. Cl.
USPC .......................................... 341/120; 341/155

(58) Field of Classification Search
USPC ........... 341/120, 155, 156; 375/326, 231, 325
See application file for complete search history.

(56) References Cited

U.S. PATENT DOCUMENTS

| | | | |
|---|---|---|---|
| 5,307,061 A * | 4/1994 | Suzuki | 341/93 |
| 6,084,974 A * | 7/2000 | Niimi | 381/104 |
| 6,104,332 A * | 8/2000 | Brandt | 341/156 |
| 6,751,271 B2 * | 6/2004 | Kien et al. | 375/326 |

* cited by examiner

*Primary Examiner* — Brian Young
(74) *Attorney, Agent, or Firm* — Fiala & Weaver P.L.L.C.

(57) ABSTRACT

Methods and apparatuses are described for a DSP receiver with an analog-to-digital converter (ADC) having high speed, low BER performance with low power and area requirements. Speed is increased for multi-path ADC configurations by resolving a conventional bottleneck. ADC performance is improved by integrating calibration and error detection and correction, such as distributed offset calibration and redundant comparators. Power and area requirements are dramatically reduced by using low BER rectification to nearly halve the number of comparators in a conventional high speed, low BER flash ADC.

20 Claims, 9 Drawing Sheets

DSP RECIEVER WITH HIGH SPEED LOW BER ADC

CROSS-REFERENCE TO RELATED APPLICATIONS

This application claims the benefit of U.S. Provisional Application No. 61/714,681, filed Oct. 16, 2012, and U.S. Provisional Application No. 61/746,018, filed Dec. 26, 2012, each of which is incorporated by reference herein in its entirety.

BACKGROUND

1. Technical Field

The subject matter described herein relates to digital signal processor (DSP) based serial receivers. In particular, the subject matter described herein relates to DSP-based serial receivers that are required to achieve a relatively low bit error rate (BER).

2. Description of Related Art

DSP-based serial receivers typically have a conventional flash analog-to-digital converter (ADC). While the traditional flash ADC can achieve a low BER requirement (e.g. $10^{-15}$) given ample area and power, there are practical limitations on ADC resolution. Since a traditional N-bit flash ADC requires $2^N-1$ comparators, power and area increase exponentially with the resolution of the ADC.

While alternative types of traditional ADCs, such as pipeline and successive approximation register (SAR), may significantly reduce the number of comparators (and hence power and area), they could not achieve a low BER at high speed. Due to a lower clock rate, an increased number of interleaved alternative ADCs (and hence increased power and area) would be required to achieve low BER at high speed, e.g., a multi-GHz (multi-gigahertz) rate.

BRIEF SUMMARY

Methods and apparatuses are described for a DSP receiver with an analog-to-digital converter (ADC) having high speed, low BER performance with low power and area requirements. Speed is increased for multi-path ADC configurations by resolving a conventional bottleneck. ADC performance is improved by integrating calibration and error detection and correction, such as distributed offset -calibration and redundant comparators. Power and area requirements are dramatically reduced by using low BER rectification to nearly halve the number of comparators in a conventional high speed, low BER flash ADC.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies. However, embodiments are not limited to the specific implementations disclosed herein. Unless expressly indicated by common numbering, each figure represents a different embodiment where components and steps in each embodiment are intentionally numbered differently compared to potentially similar components in other embodiments. The left-most digit(s) of a reference number identifies the number of the figure in which the reference number first appears.

Figure 1:
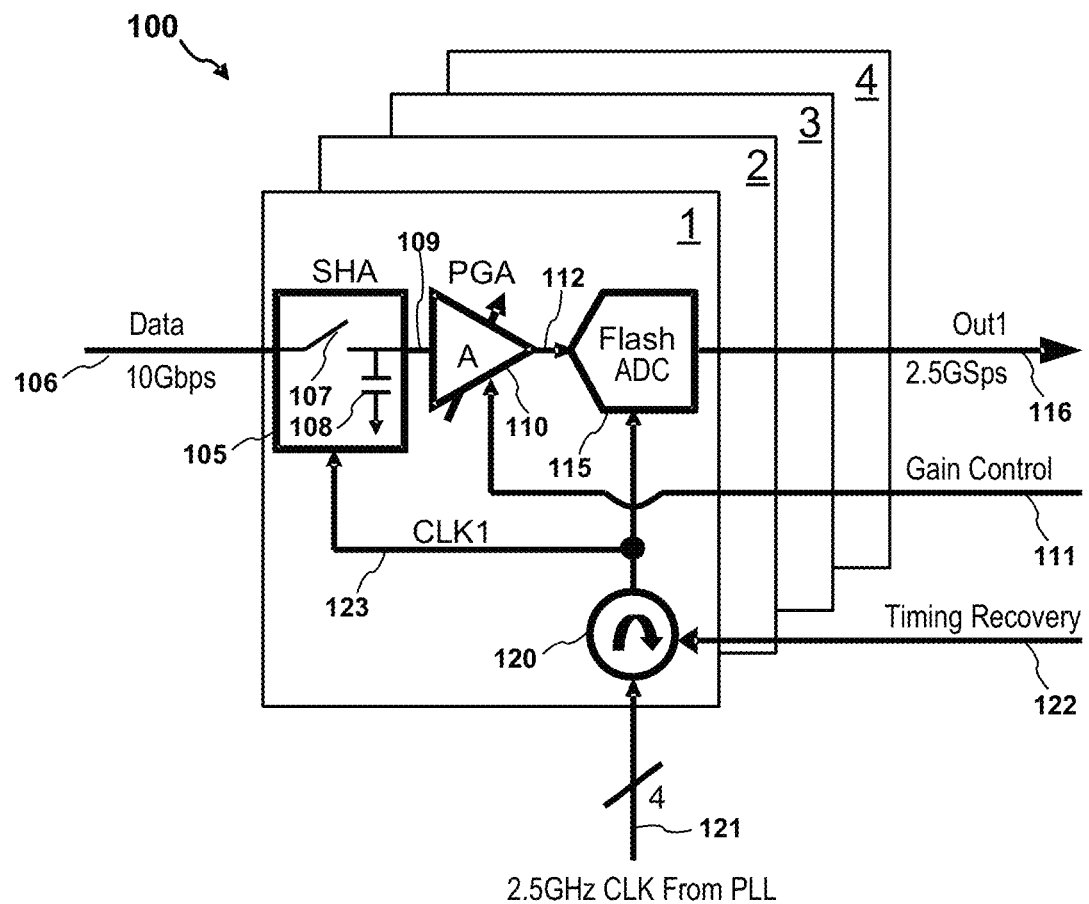
FIG. 1 shows a simplified block diagram of an exemplary embodiment of a time-interleaved four-channel ADC and associated timing diagram.
Figure 1:
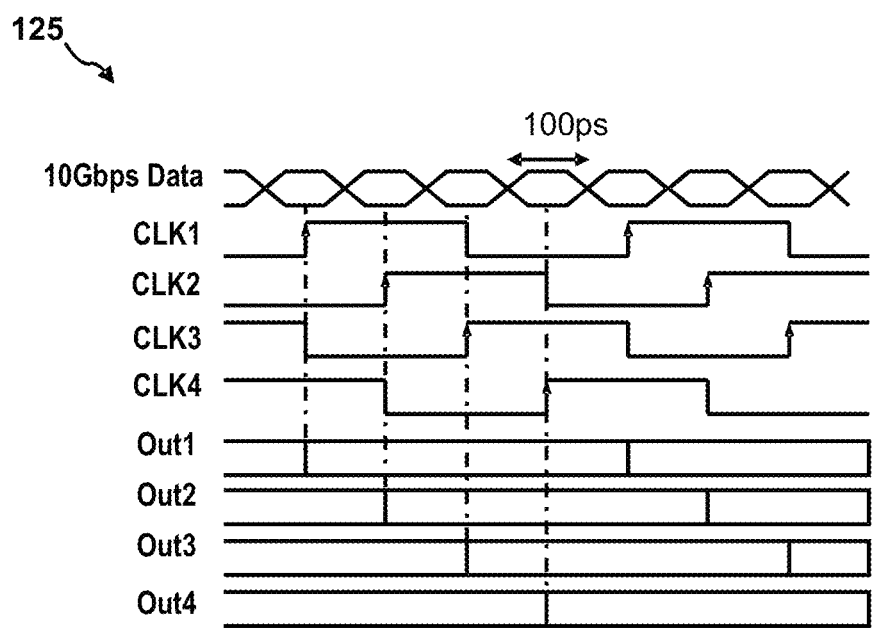

Exemplary embodiments will now be described with reference to the accompanying figures.

DETAILED DESCRIPTION

I. Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example" or the like indicate that the subject matter described may include a particular feature, structure, characteristic, or step. However, other embodiments do not necessarily include the particular feature, structure, characteristic or step. Moreover, "embodiment," "example" or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection or through an indirect electrical connection via other devices and connections.

II. Exemplary DSP Receiver with High Speed Low BER ADC

Methods, systems, and apparatuses will now be described for a DSP receiver with an ADC having high speed, low BER performance with low power and area requirements. Speed is increased for multi-path ADC configurations by resolving a conventional bottleneck. ADC performance is improved by integrating calibration and error detection and correction, such as distributed offset calibration and redundant comparators. Power and area requirements are dramatically reduced by using low BER rectification to nearly halve the number of comparators in a conventional high speed, low BER flash ADC.

In one embodiment, a device, such as but not limited to an ADC, receiver or transceiver, comprises a multi-path ADC having a coarse comparator in a first path operating in parallel with a delay circuit, sample-and-hold (SH) circuit or track-and-hold (TH) circuit in a second path. The delay, SH or TH circuit may have multiple stages, with one or more stage in parallel with the coarse or more significant bit comparator. A rectifier in series with the delay, SH or TH circuit is controlled by an output of the coarse comparator. A fine or sub ADC determines less significant bits from the rectified signal. The sub ADC may comprise error detection, such as excess or redundant comparators to detect rectifier errors. The multi-path ADC may further comprise error avoidance features. For example, the multi-path ADC may comprise distributed or multi-point offset calibration. There may be a coarse comparator offset calibrator for the coarse comparator and a fine or sub ADC offset calibrator for the sub ADC. Each comparator in the sub ADC may comprise an offset calibrator. In embodiments with an amplifier, e.g., a programmable gain amplifier in the second path, there may be an offset calibrator for the amplifier. Each calibrator may operate independent of other calibrators.

In another embodiment, a device comprises a multi-path, rectifying ADC that converts an analog signal into a plurality of bits. A first path of the ADC determines a first bit in the plurality of bits, where the first bit may be a more significant bit or bits. In the first path one or more comparators generate the first bit(s). The first comparator is configured to receive the analog signal at a first time. A second path of the ADC determines a second bit or bits in the plurality of bits, where the second bit or bits may be less significant bits. The second path comprises a rectifier that rectifies the analog signal. The rectifier is configured to receive the analog signal at a second time after the first time. The time offset between the first and second times provides the first comparator sufficient sampling and regeneration time so the ADC can operate at a higher clock frequency. A plurality of comparators coupled to an output of the rectifier generates the second bit or bits from the rectified signal.

In some embodiments, the ADC (e.g. the second path) may comprise a signal hold circuit operating in parallel with the first comparator in the first path. The rectifier may be coupled to an output of the signal hold circuit. The hold circuit may comprise a delay circuit, a sample-and-hold (SH) circuit or a track-and-hold (TH) circuit. The delay circuit, SH circuit or TH circuit may comprise multiple stages. The first comparator may be coupled in parallel with one or more stages and may receive the analog signal from one of the stages. The rectifier may be controlled by an output of the first comparator, e.g., the first bit(s).

In some embodiments, the plurality of comparators in the second path may have an error detection feature, such as at least one additional comparator configured to detect rectification errors. The additional comparators may be configured with negative thresholds to detect negative polarity sampling errors following full-wave rectification where all samples should have the same polarity. A decoder in the second path may provide error correction by mapping outputs of the additional comparators to outputs of comparators in the plurality of comparators having positive thresholds.

In some embodiments, the ADC may be configured with error avoidance features. These error avoidance features may be distributed and operate independent of one another. The first comparator A first offset calibrator may calibrate the first comparator. A second offset calibrator having a plurality of calibrators may calibrate each of the plurality of comparators. The first and second offset calibrators may be configured to separately calibrate comparators. In embodiments with an amplifier, e.g., a programmable gain amplifier in the second path, there may be a third offset calibrator to calibrate the amplifier. The third offset calibrator may comprise chopping switches coupled to outputs of the amplifier. A comparator may be coupled to the chopper switches. A calibrating digital to analog converter (DAC) may be coupled to the comparator. The DAC calibrates the amplifier.

In another embodiment, a method of converting an analog signal into a digital signal comprises, at a first time, providing a held analog signal to a first comparator. In the first comparator, the held analog signal is compared to a first threshold to determine a more significant bit. At a second time subsequent to the first time, the held analog signal is provided to a rectifier. A rectifier control signal is determined from the more significant bit. The held analog signal is rectified into a rectified signal in accordance with the rectifier control signal. In a plurality of second comparators, the rectified signal is compared to a plurality of thresholds to determine less significant bits.

The method may further comprise, in the plurality of second comparators, comparing the rectified signal to a plurality of negative thresholds to determine whether there is a rectification error. If an error is detected by any one of the plurality of comparators having a negative threshold then correcting an error in at least one of the more significant bit and the less significant bits.

Considering the first comparator to be in a first path and the rectifier to be in a second path, the method may further comprise calibrating the first path independent of calibrating the second path. For example, this may comprise calibrating an offset of the first comparator independent of calibrating offsets of the plurality of second comparators. Comparator calibration may use an enhanced binary search comprising, at each step in a plurality of steps of the enhanced binary search for each respective comparator, determining a distance to a threshold for the respective comparator threshold; and selecting a shortest distance of the calculated distances to calibrate an offset of the respective comparator.

In embodiments where the second path comprises an amplifier that amplifies the held signal, calibrating the second path may further comprise calibrating an offset of the amplifier. In one embodiment, calibration may comprise shorting the amplifier inputs, closing a first set of chopper switches coupled to the amplifier output and determining a first offset value, closing a second set of chopper switches and determining a second offset value and determining a DAC calibration code for the amplifier from the first and second offset values.

In embodiments where a plurality of ADCs operate the method as a plurality of channels, the method may further comprise recovering data from the more significant bit and less significant bits and combining the recovered data with recovered data from at least one other channel operation of the method on the analog signal. In some embodiments, continuous background calibration may be performed by calibrating each of a plurality of analog-to-digital converters (ADCs) before activation to perform the method in one of a plurality of channels. Each of the plurality of ADCs is rotated between active and inactive status while maintaining continuous operation of the method in the plurality of channels.

Advantages of embodiments include high speed, low BER performance with low power and area requirements. Speed is increased for multi-path ADC configurations by resolving a conventional bottleneck. By operating the coarse comparator in parallel with a hold stage to permit the comparator to start a conversion cycle before rectification, the comparator regeneration time bottleneck is removed and the ADC can operate at a higher clock frequency. ADC performance is improved by integrating calibration and error detection and correction into the ADC, such as distributed or multi-point offset calibration and redundant comparators. Power and area requirements are dramatically reduced by using low BER rectification to nearly halve the number of comparators in a conventional high speed, low BER flash ADC.

Embodiments of systems, devices and methods may be implemented in various architectures, each with various configurations. Several detailed features and embodiments are discussed below.

In Section III, high speed, low BER ADC architecture is described that achieves high speed, low BER performance while nearly halving the number of comparators in a conventional flash ADC. A low BER of $10^{-15}$ may be achieved in part by delayed rectification, error avoidance calibration, error detection and error correction features.

In Section IV, an error detection and correction feature is described. This feature may be referred to as "dead zone" error detection and correction. Deadzone error detection and correction may be implemented by adding redundant comparators and digital correction in a decoder.

In Section V, an error avoidance feature is described. This feature may comprise a distributed or multi-point digital offset correction scheme that may be implemented by the ADC is described. As will be explained in that section, the multi-point digital offset correction scheme utilizes enhanced binary search algorithms.

In Section VI, ADC methodology embodiments are described to achieve high speed, low BER performance with nearly half the number of comparators in a conventional flash ADC.

III. High Speed Low BER ADC Architecture

A. Introduction

Flash ADC is a popular topology for high speed low/mid resolution applications. In general, flash topology comprises a tradeoff between large power/area versus higher speed and low BER, i.e. BER less than $10^{-15}$. Accordingly, flash ADCs are widely used in high speed data communication applications. An ultra-high speed ADC, e.g. 10 Gs/s, is typically realized by multi-channel ADCs due to process speed limitations. A multi-channel ADC may also be referred to as a time-interleaved ADC.

As one of many examples of ADC topology in which embodiments may be implemented, FIG. 1 shows a simplified block diagram of an exemplary embodiment of a time-interleaved four-channel ADC and associated timing diagram. FIG. 1 presents a specific example of an embodiment of a device, such as a high speed serial data communication receiver, having a high speed, low BER, time-interleaved multi-channel ADC 100. In this embodiment, ADC 100 comprises a 6-bit 10 giga-samples per second (GS/s) ADC. This is accomplished by time-interleaving four 6-bit 2.5 GS/s ADCs 1, 2, 3, 4. Each ADC 1-4 provides a channel in four channel ADC 100. Each simplified ADC 1-4 comprises sample-and-hold amplifier SHA 105, programmable gain amplifier PGA 110, flash ADC 115 and phase interpolator 120.

Phase interpolator 120 receives as inputs 2.5 GHz clock 121 provided by phase locked loop PLL (not shown) and timing recovery signal 122. From these inputs, in ADC 1, phase interpolator 120 generates sampling clock CLK1 123, which is provided to SHA 105 and flash ADC 115.

SHA 105 may comprise a two stage amplifier to provide a wider tracking bandwidth. SHA 105 receives as inputs sampling clock CLK1 123 and input signal 106, in this case a 10 gigabit per second (Gbps) input signal. SHA 105 samples and holds samples of input signal 106. SHA Switch 107 exemplifies the sampling aspect and capacitor 108 exemplifies the holding aspect of SHA 105. SHA 105 generates held samples 109.

PGA 110 adjusts the gain of each ADC channel to compensate for channel gain mismatch. PGA 110 receives as inputs held samples 109 and gain control 111. PGA 110 generates amplified samples 112.

Flash ADC 115 receives as inputs amplified samples 112 and sampling clock 123. Flash ADC 115 converts amplified samples 112 to digital form. Flash ADC 115 generates output OUT1 116, which is a 2.5 GSps output stream of data.

Timing diagram 125 shows how each of four ADCs 1-4 process different portions of input signal 106 based on sampling clocks CLK1 -4 to generate different portions of output signal OUT1-4 116. When combined or interleaved, the four 2.5 GSps output signals OUT1-4 116 recover a 10 GSps digital form of 10 GSps input signal 106.

B. Pipeline ADC Topology

A multi-stage ADC is designed to reduce ADC complexity, power and area requirements using a multi-stage conversion. A pipeline topology is inherently a multi-stage ADC. A pipeline topology ADC is a multi-stage ADC that performs sequential or cascaded conversions. Generally, an N-bit pipeline ADC performs a one-bit coarse conversion before an N−1 bit fine conversion.

Figure 2:
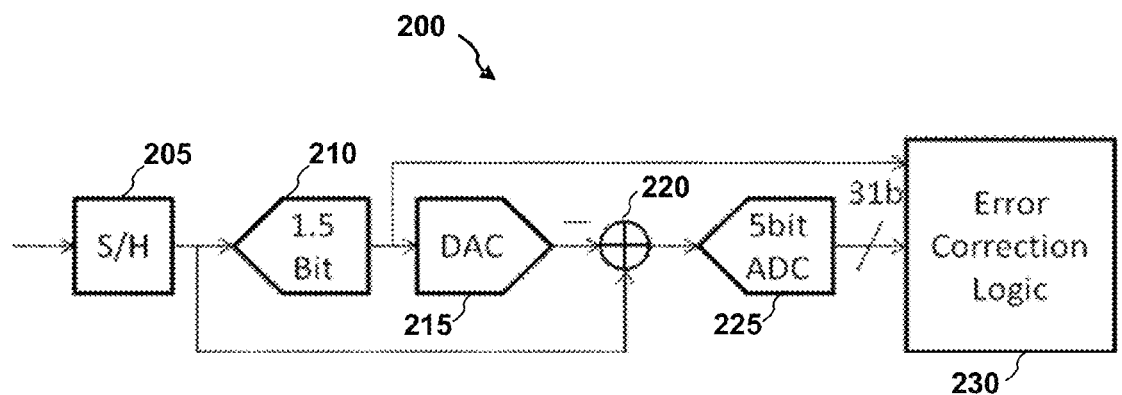
FIG. 2 shows a simplified block diagram of an exemplary embodiment of a two stage pipeline ADC structure.

FIG. 2 shows a simplified block diagram of an exemplary embodiment of a two stage pipeline ADC structure and, specifically, a 6-bit pipeline ADC. Pipeline ADC 200 comprises sample and hold (SH) 205, coarse ADC 210, DAC 215, subtraction block 220, fine ADC 225 and error correction logic 230. Coarse ADC 210 is designated as a 1.5 bit ADC because it determines a more (e.g. most) significant bit and provides error correction. DAC 215 converts the more significant bit into an analog signal so that subtraction block 220 can subtract it from the signal sampled by SH 205. By doing so, fine ADC 225 only operates on the remainder of the sampled signal to determine five less significant bits. The converted data is provided to error correction logic 230 to detect and correct any errors in the conversions.

While pipeline topology provides high resolution and throughput, it generally trades off latency and speed, requires a high degree of accuracy in the digital to analog (DAC) and subtraction operations and provides only a half clock cycle of the sampling clock to perform coarse ADC conversion, DAC conversion, subtraction and fine or sub ADC conversion. These problems require lower frequency clocks relative to flash ADCs. Given limited regeneration time for the coarse ADC, a high speed pipeline topology would result in high power consumption and high BER unless the limited regeneration and other problems are solved.

C. Flash Folding ADC Topology

A Flash ADC is a faster converter relative to other ADC topologies. However, traditional flash ADCs need $2^N-1$ comparators to accomplish an n-bit conversion. This exponential increase in comparators for each bit of resolution results in exponential increases in power and area consumption.

A folding topology is a technique to reduce the number of comparators in an ADC by making comparators with particular reference values reusable over a wider range of input values. A folding topology rearranges, e.g. divides, a signal voltage range and simultaneously or sequentially processes the rearranged signal. One type of signal rearranging or folding is signal rectification. Specifically, full wave rectification is used to preserve an entire signal.

One folding ADC topology is a two-time (2×) folding N-bit ADC. A 2× folding ADC may be a two-stage ADC with 1-bit coarse ADC or MSB comparator and an N−1 bit fine or sub-ADC. The 1-bit coarse ADC may be used to determine the sign or polarity of an input signal compared to the midpoint of reference (zero threshold). If the sign is positive, i.e., if the signal is above the zero threshold, the 1-bit coarse ADC will not cause a rectifier to rectify the input signal. If the sign is negative, the 1-bit coarse ADC will cause a rectifier to flip or rectify the polarity of the input signal. By rectifying an input signal, power and area requirements for a fine ADC are reduced because the operational range of the fine ADC has been reduced by half compared to a full positive and negative range. The fine ADC will not require as many comparators and references, which eliminates power and area. Rectification may occur in either direction (positive or negative) to achieve the same reduction in area and power necessary for a fine ADC.

Figure 3:
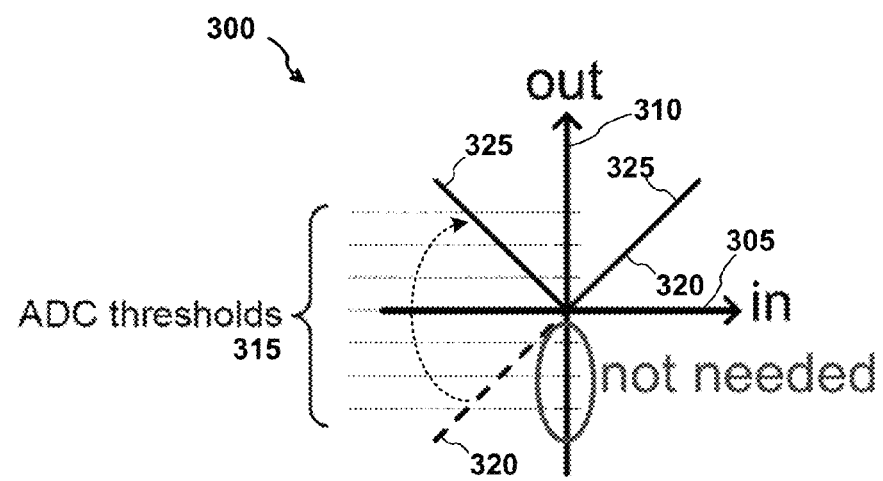
FIG. 3 shows the effect of rectifying an input signal on an ADC.

FIG. 3 shows the effect of rectifying an input signal on an ADC. Plot 300 shows rectifier input signal IN 305 on the x-axis and rectifier output signal OUT 310 on the y-axis. Several ADC thresholds 315 for several comparators are shown as horizontal lines. Unrectified signal input range 320 is shown as a diagonal line, solid above the zero threshold and dashed below the zero threshold. Rectified signal range 325 shows the negative signal input range 320 flipped above the zero threshold. Following rectification, ADC comparators having negative thresholds 315 are no longer needed.

Figure 4:
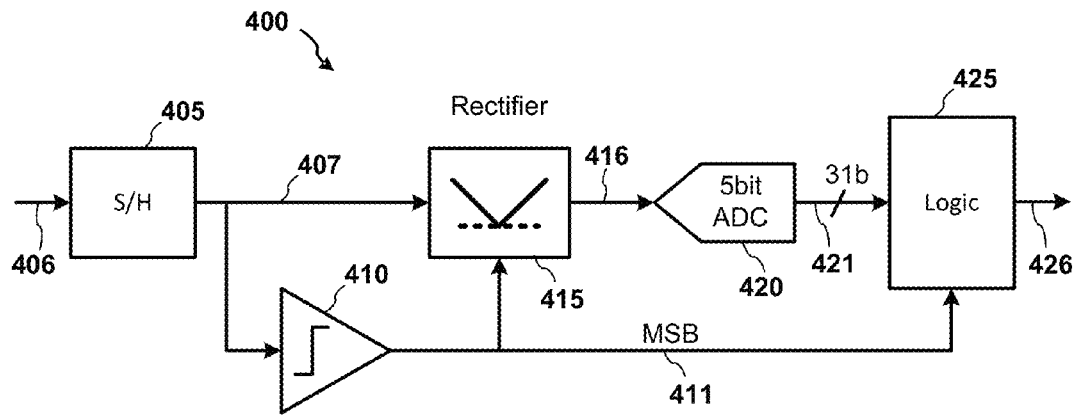
FIG. 4 shows a block diagram of an exemplary embodiment of a 6-bit two-stage folding ADC.

FIG. 4 shows a block diagram of an exemplary embodiment of a 6-bit two-stage folding ADC. Folding ADC 400 comprises sample and hold SH 405, coarse comparator 410, rectifier 415, fine or sub-ADC 420 and logic 425. Folding ADC 400 may be one of multiple amplifiers in ADC 100, for example. Coarse comparator 410 may be said to be in a first path while rectifier 415 and fine ADC 420 may be said to be in a second path. These paths may comprise other components. For example, the first path may comprise a PGA (not shown).

SH 405 samples and holds samples of input signal 406. Held samples 407 are provided to coarse comparator 410 and rectifier 415.

Coarse comparator 410 may comprise one or more comparators. Coarse comparator 410 compares held samples 407 to one or more references (not shown). Based on the comparison, coarse comparator 410 generates more significant bit(s) 411 (e.g. most significant bit MSB), which may indicate the polarity of held samples 407. More significant bit(s) 411 is (are) provided rectifier 415 and logic 425.

Rectifier 415 rectifies held samples 407 based on control provided by more significant bit(s) 411. Rectifier may pass or rectify held samples 407 based on more significant bit(s) 411. For example, as previously indicated, if more significant bit(s) 411 indicates held samples 407 have a positive polarity then rectifier 415 may pass held samples 407. On the other hand, if more significant bit(s) 411 indicates held samples 407 have a negative polarity then rectifier 415 may rectify held samples 407. Rectifier generates rectified signal 416, which does not require that particular samples be rectified.

Fine ADC 420 comprises a plurality of comparators (not shown). Each comparator in fine comparator 420 compares rectified signal 416 to a reference. Based on the comparisons, fine ADC 420 generates less significant bits 421. Although fine ADC 420 is a five-bit ADC in this example, fine comparator 420 generates 31 bits for further processing.

Logic 425 receives more significant bit(s) 411 and less significant bits 421. Logic 425 may recover transmitted data from more significant bit(s) 411 and less significant bits 421. Logic 425 may also apply error detection and correction logic to more significant bit(s) 411 and less significant bits 421. Logic 525 resolves the 32 bits from less significant bits 421 and more significant bit(s) 411 to 6-bits through error correction and encoding. More or less resolution than 6 bits may be provided in many possible embodiments.

Coarse conversion by coarse comparator 410, rectification by rectifier 415 and conversion by fine ADC 420 must complete in a half cycle of a sampling clock (not shown). When sampling clock is operated at a high speed frequency, metastability of coarse comparator 410 becomes a potential problem that drives up BER. Clock frequency is limited to maintain a low BER. This problem is similar to the problem in the pipeline topology. Offset is another potential problem that limits clock frequency to maintain a low BER. Some adjustments must be made to the general design of folding ADC 400 to obtain high speed, low BER performance.

Figure 5:
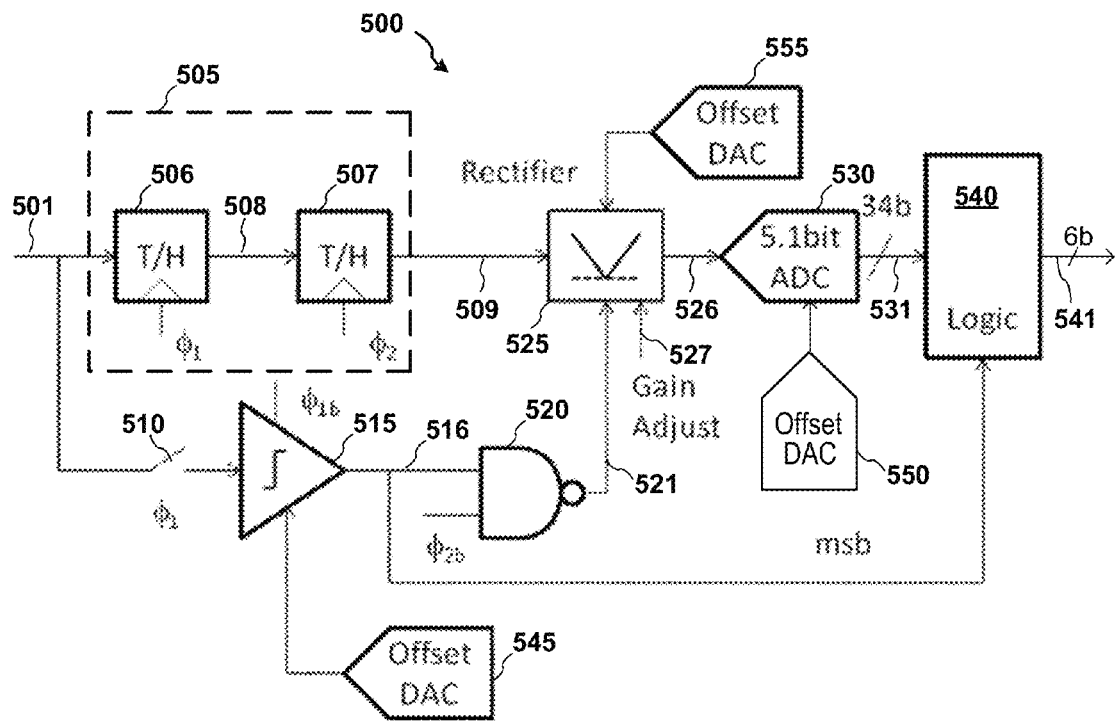
FIG. 5 shows a more detailed block diagram of an exemplary embodiment of a G-bit folding ADC in accordance with an embodiment.

FIG. 5 shows a more detailed block diagram of an exemplary embodiment of a G-bit folding ADC in accordance with an embodiment. High speed, low BER ADC 500 comprises SHA 505, sampling switch 510, coarse comparator 515, rectifier control logic 520, rectifier 525, fine ADC 530, logic 540, coarse calibrator 545 and fine calibrator 550. Other embodiments of high speed, low BER ADC 500 may comprise more or fewer components. Other embodiments may employ the high speed, low BER features in this embodiment and/or additional high speed low BER features in other architectures, e.g., in a pipeline topology.

Coarse comparator 510 may be said to be in a first path while rectifier 525 and fine ADC 530 may be said to be in a second path. These paths may comprise other components. A first stage of high speed, low BER ADC 500 may be said to comprise SHA 505 and coarse comparator 515 while a second stage may be said to comprise rectifier 525 and fine ADC 530. In some embodiments, the first stage may complete in a in a half cycle of the sampling clock and second stage may complete in another half cycle of the sampling clock SHA 505 samples and holds input signal 501. In this particular embodiment, SHA 505 comprises a multi-stage SHA. Specifically, SHA 505 comprises first stage 506 and second stage 507. First stage 506 comprises a TH operated by first clock Φ1 and second stage 507 comprises a TH operated by second clock Φ2. SHA first stage 506 tracks and holds input signal 501 and generates first held sample 508. SHA second stage 507 tracks and holds first held sample 508 and generates second held sample 509. The multiple stages effectively delay or extend the sample hold by the difference in time between first clock Φ1 and second clock Φ2, or, alternatively, first and second phases or rising and falling edges of the same clock. The difference may be, for example, half a clock cycle, i.e., half period. Thus, in other embodiments, SHA 505 or one or more of its stages may comprise one or more delays. In other embodiments, the time difference between clocks or phases or other delays may be more or less than half a clock cycle. Second held sample 509 is provided to rectifier 525.

Sampling switch 510 and coarse comparator 515 operate in parallel with SHA 505. Like SHA first stage 506, sampling switch is operated by first clock Φ1. Thus, at the same time, SHA first stage 506 and coarse comparator 515 sample input signal 501. Coarse comparator compares the sampled input signal 501 to a reference based on coarse comparison clock Φ1b, which may be an inverted and delayed version of first clock Φ1. The time difference between first and second clocks Φ1b, Φ2 permits coarse comparator to convert a more significant bit(s) of input signal 501 before, e.g., a half cycle before, rectifier 525 receives second held sample 509 to perform a signal folding operation. This permits BER to be dramatically reduced at high speed. In some embodiments, conversion by coarse comparator 515 happens at the end of a tracking period and beginning of a hold period. Coarse comparator 515 generates more significant bit(s) 516, which is (are) provided to rectifier control logic 520 and logic 540.

Rectifier control logic 520, in this embodiment, is a nand gate. However, the control logic may vary among embodiments. Rectifier control logic 520 receives more significant bit(s) 516 and a rectifier control clock Φ2b. Rectifier control logic 520 generates rectifier control signal(s) 521. Based on timing provided by rectifier control clock Φ2b, rectifier control signal(s) 521 controls switches in rectifier 525 to pass second held sample 509 if it has a positive polarity and to rectify second held sample 509 if it has a negative polarity as indicated by most significant bit(s) 516.

Rectifier 525 comprises chopper switches that can pass or reverse the polarity (i.e. rectify) second held sample 509. Rectifier receives second held signal 509 and rectifier control signal(s) 521. Rectifier generates rectified signal 526, although the polarity of second held sample 509 may not be reversed depending on its polarity. Rectification refers to input signal 501 as a whole being folded to have a common polarity, either entirely positive or entirely negative, to reduce the range of references and the number of comparators necessary in fine ADC 530. In other embodiments, additional folding may occur to further reduce the number of references and comparators in fine ADC 530. Rectifier 525 may comprise a PGA (not shown) to increase or decrease the amplitude of second held sample 509. The gain of a PGA may be adjusted by gain adjust 527.

Fine ADC 530 receives rectified signal 526 and generates fine or less significant bits 531. Fine ADC 530 comprises a plurality of comparators (not shown). Each comparator in fine comparator 530 compares rectified signal 526 to a reference. Based on the comparisons, fine ADC 530 generates less significant bits 531. Although fine ADC 530 is a five-bit ADC in this example, fine ADC 530 generates 31 bits for further processing.

Fine ADC 530 may comprise one or more error detection and correction features. This is why fine ADC 530 is a 5.1 bit ADC instead of a 5 bit ADC. While it takes 31 comparators to generate 31 bits, fine ADC may comprise redundant or additional comparators with references having a polarity opposite to the polarity to which rectifier 525 rectified input signal 501. For example, fine ADC 530 may comprise a total of 34 comparators. The additional comparators may detect folding errors. Folding error detection and correction may be used to address mismatch between the first and second paths. Additional offset correction DACs are added for the MSB comparator and rectifier stage.

Logic 540 receives more significant bit(s) 516 and less significant bits 531. Logic 540 may output 6-bits, e.g. a 2.5 GS/s stream of 6-bits, for further processing, e.g. in a DSP. Logic 540 may comprise bubble detector logic, error correction logic, encoder logic, demultiplexer logic and/or other logic. Logic 540 may recover transmitted data from more significant bit(s) 516 and less significant bits 531. Logic 540 may also apply error detection and correction logic to more significant bit(s) 516 and less significant bits 531. Logic 540 resolves the 32 bits from less significant bits 531 and more significant bit(s) 516 to 6-bits through error correction and encoding. More or less resolution than 6 bits may be provided among many possible embodiments.

Coarse calibrator 545, such as an offset DAC, provides error avoidance calibration to coarse comparator 515. Fine calibrator 550, such as an offset DAC, provides error avoidance calibration to fine ADC 530. Rectifier calibrator 555, such as an offset DAC, provides error avoidance calibration to coarse comparator. In some embodiments, coarse calibrator 545, fine calibrator 550 and rectifier calibrator 555 may operate independent of one another. Calibration may occur prior to operation of high speed, low BER ADC 500 or may occur, e.g., periodically, during operation of high speed, low BER ADC 500. In some embodiments, continuous background calibration of high speed, low BER ADC 500 may be performed by calibrating each of a plurality of high speed, low BER ADC 500 in ADC 100 before activation. Each of a plurality of high speed, low BER ADC 500 could be rotated between active and inactive status while maintaining continuous operation of each active high speed, low BER ADC 500. High speed, low BER ADC 500 rotated into inactive status may be calibrated or recalibrated before reactivation.

Figure 6:
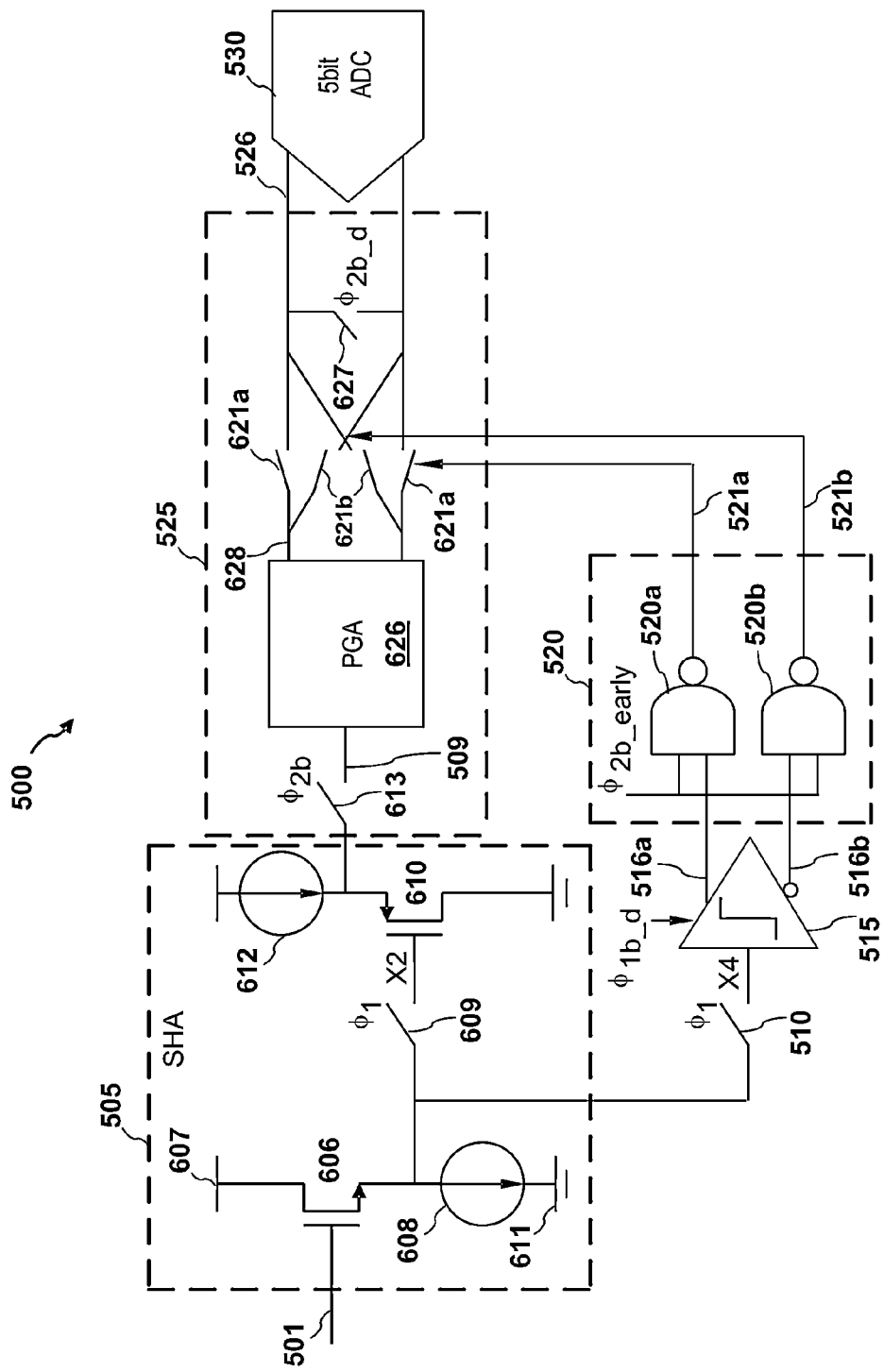
FIG. 6 shows a more detailed block diagram of an exemplary embodiment of a G-bit folding ADC with MSB comparator in parallel with an SHA stage.
Figure 7:
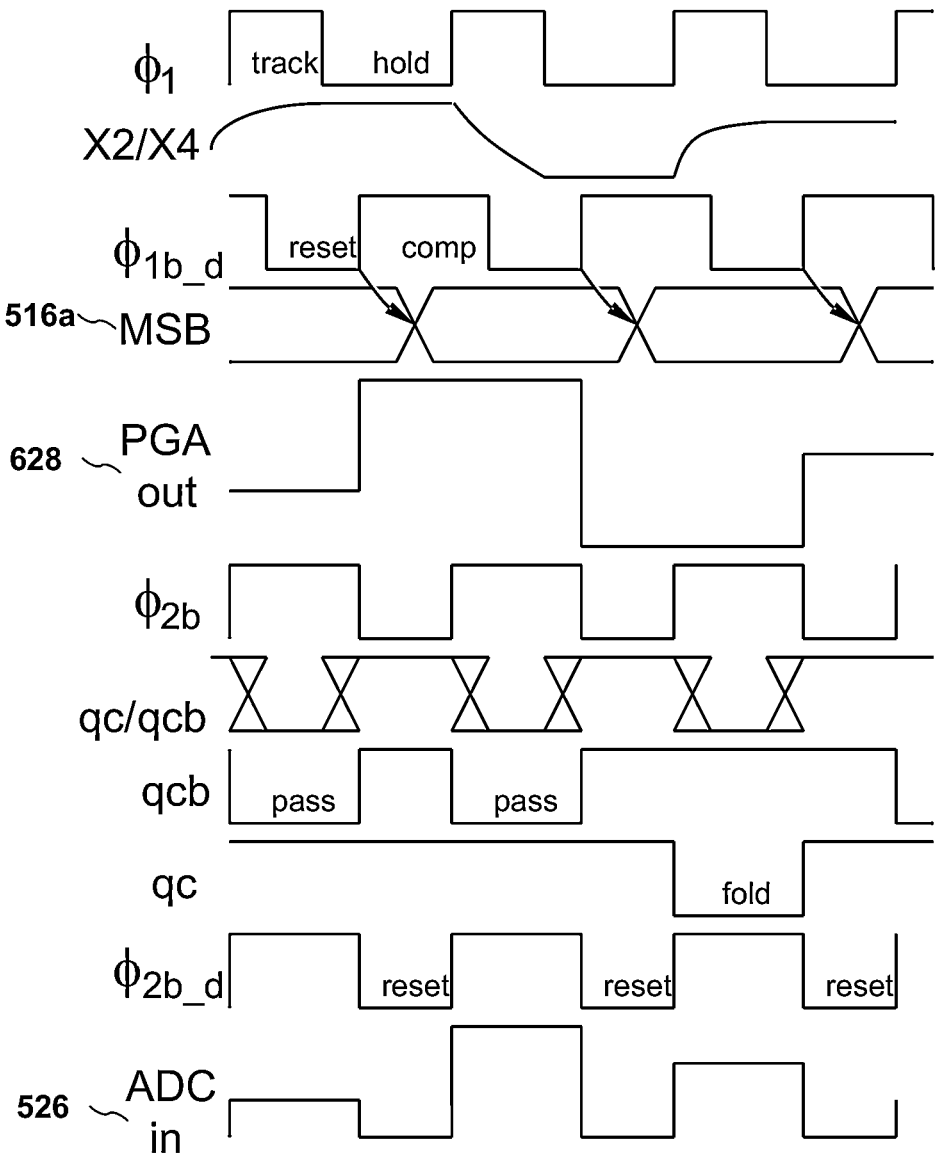
FIG. 7 shows an exemplary timing diagram of a folding ADC in accordance with the embodiment in FIG. 6.

FIG. 6 shows a more detailed block diagram of an exemplary embodiment of a G-bit folding ADC with MSB comparator in parallel with an SHA stage. FIG. 6 will be discussed with reference to numbering in FIG. 5 and in conjunction with timing in FIG. 7. FIG. 7 shows an exemplary timing diagram of a folding ADC in accordance with the embodiment in FIG. 6.

FIG. 6 shows more detailed embodiments of some components in FIG. 5. The components shown with more detail are SHA 505, coarse comparator 515, rectifier control logic 520 and rectifier 525. Other embodiments of high speed, low BER ADC 500 may comprise more or fewer components and the components may be implemented in different ways. These embodiments of components are discussed below with reference to the timing diagram presented in FIG. 7.

In this embodiment, SHA 505 is implemented as a two-stage source follower. The first stage source-follower comprises NMOS transistor 606, with its gate node coupled to input signal 501, its drain node coupled to power supply 607, and its source node coupled to first current source 608. First SHA switch 609 is coupled to the source node of NMOS transistor 606. TH 506 is implemented as NMOS transistor 606 and first SHA switch 609. Sampling switch 510 is a duplicate of first SHA switch 609. Sampling switch 510 is also coupled to the source node of NMOS transistor 606. Sampling switch 510 and first SHA switch 609 are operated by first clock Φ1.

The second stage source-follower comprises PMOS transistor 610, with its gate node coupled to first SHA switch 609, its drain node coupled to ground 611, and its source node coupled to second current source 612. Second SHA switch 613 is coupled to the source node of PMOS transistor 610. TH 507 is implemented as PMOS transistor 610 and second SHA switch 613. Second SHA switch 613 is operated by second clock Φ2b. Switch 613 is a low-on switch in this example.

Coarse comparator 515 is implemented with complementary outputs 516a, 516b. Similarly, rectifier control logic 520 is implemented with complementary logic 520a, 520b respectively receiving complementary outputs 516a, 516b. Pass switch control 516a causes rectifier 525 to pass second held signal 509. Rectify switch control 516b causes rectifier 525 to switch the polarity of second held signal 509. As a result, rectifier control logic 520 generates complementary rectifier controls 521a, 521b based on timing provided by rectifier control clock Φ2b_early, which transitions before second clock Φ2b provides second held sample 509 to rectifier 525. Based on timing provided by rectifier control clock Φ2b_early, rectifier control signal(s) 521 controls switches in rectifier 525 to pass second held sample 509 if it has a positive polarity and to rectify second held sample 509 if it has a negative polarity as indicated by complementary outputs 516a, 516b.

Rectifier 525 comprises PGA, pass switches 621a, rectify switches 621b and reset switch 627. Switches 621a, 621b, 627 are low-on switches in this example. PGA 626 provides variable gain to second held sample 509 in accordance with gain adjust 527. The offset of PGA 626 may be calibrated by rectifier calibrator 555. PGA 626 provides differential outputs to pass switches 621a and rectify switches 621b. Pass switches 621a are controlled by pass switch control 516a. Rectify switches 621b are controlled by rectify switch control 516b. Pass switch control 516a causes rectifier 525 to pass second held signal 509. Rectify switch control 516b causes rectifier 525 to switch the polarity of second held signal 509. Reset switch 627 is controlled by reset control Φ2b_d. Reset control Φ2b_d closes reset switch 627 following passage or rectification of second held signal 509 to reset rectifier 525 for the next second held signal 509.

To recap, in a flash ADC, the number of comparators tends to increase exponentially with the number of bits ($2^N$), which results in a significant increase in power consumption and area. It is desirable to achieve a figure of merit lower than 0.5 pJ/conversion step. To achieve this figure of merit, the number of comparators must be reduced. A two-step folding ADC topology reduces the number of comparators by about 50% by first detecting the MSB, folding the input signal and allowing the fine or sub-ADC to resolve half the full scale or range of the input signal. By folding the data after the MSB conversion, the probability of a meta-stable event is alleviated, which reduces BER.

Rectifier switches ensure that the data input to the fine or sub-ADC is always in the same half plane. As a result, the "zero crossing" at which a meta-stable event in the MSB comparator is most probable is always located in the same "region" at the input of the sub-ADC. A meta-stable event appears more as noise and not as a large "glitch." The use of an additional T/H stage increases the available regeneration time for the MSB comparator and permits the ADC to operate at a higher clock frequency. This reduces the probability of an MSB comparator meta-stable event, which improves the BER There are no limitations on application of embodiments. Among other applications, this ADC topology serves high speed, low BER applications. For example, without limitation, embodiments may be used in present and future 10 Gb/s, 25 Gb/s and 40 Gb/s multi-mode fiber, backup plane, chip-2-chip and wireless transceivers. DSP transceivers may be used, for example, in optical and hard disk drive applications. Embodiments may be used in current and future enterprise networking receiver solutions, which typically require very high speed, low BER performance with low area and power consumption requirements. Given the reduction in area and power, resolution may be increased from traditional 6-bit resolution to 7-bit resolution at nearly the same area and power consumption.

IV. Error Detection and Correction

Error detection and correction may be performed to reduce BER. A potential problem in folding the input signal after more significant bit(s) is(are) detected is that mismatch between the input signal processed in the coarse ADC path (i.e. the first path) and the input signal processed in the fine ADC path (i.e. the second path) will result in a "dead zone" in the transfer function of the ADC. This can result in a limitation of the effective number of bits (ENOB) of the ADC. The impact of the dead zone on ENOB performance of the ADC can be reduced or eliminated by adding error detection and correction to the ADC.

Figure 8:
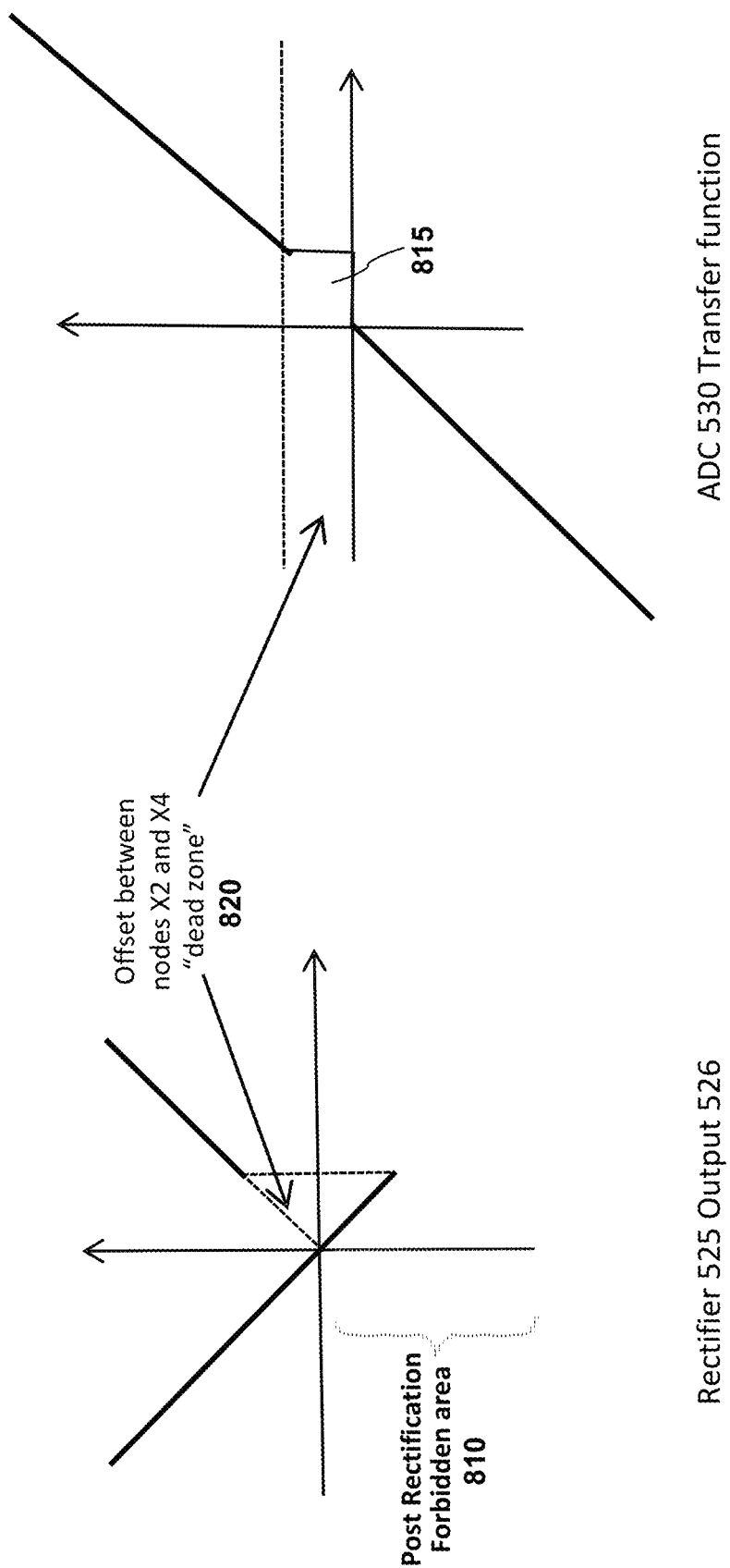
FIG. 8 shows an exemplary "dead zone" error that may result in a transfer function error in a rectifying ADC.

FIG. 8 shows an exemplary "dead zone" error that may result in a transfer function error in a rectifying ADC. As previously discussed with respect to FIG. 3 and again shown in FIG. 8, rectification of the input signal to one polarity renders the other polarity a forbidden area. If a sample of the input signal is in the forbidden area 810 and goes undetected then it may not be reflected in the digital output, effectively creating a gap 815 in the transfer function of the ADC. A rectification error could cause a deadzone error. Additionally, an offset 820 or mismatch between the input signal processed in the coarse ADC path (i.e. the first path) and the input signal processed in the fine ADC path (i.e. the second path) could cause a persistent or periodic deadzone error and resultant gap 815 in the ADC transfer function shown in FIG. 8.

Figure 9:
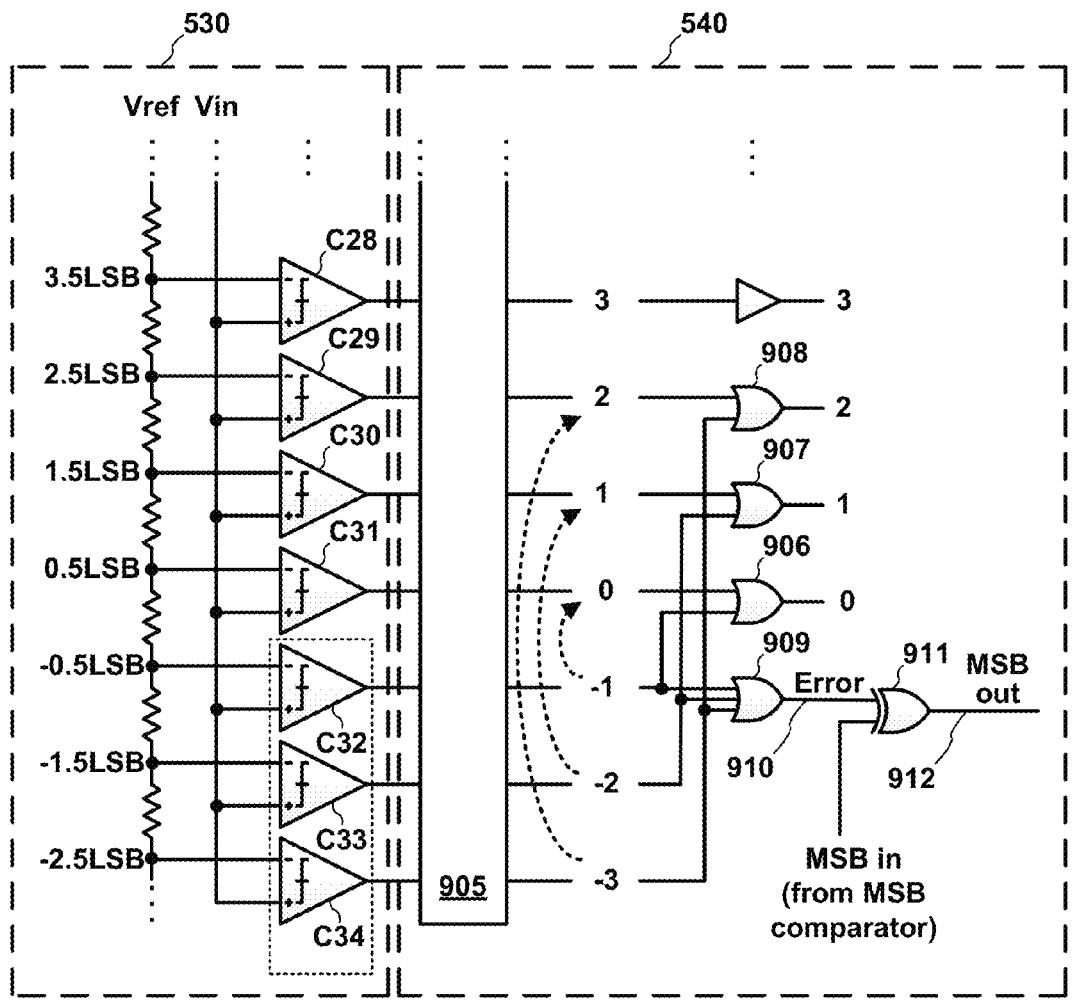
FIG. 9 shows a block diagram of an exemplary embodiment of "dead zone" error detection and correction logic that may be implemented in an ADC in accordance with an embodiment.

In one embodiment, to detect a "dead zone" error, additional or redundant comparators may be added to the fine or sub-ADC with references having a polarity opposite the polarity to which the rectifier rectifies the input signal. FIG. 9 shows a block diagram of an exemplary embodiment of "dead zone" error detection and correction logic that may be implemented in an ADC in accordance with an embodiment. FIG. 9 shows a portion of fine ADC 530 and a portion of error correction logic in logic 540.

In the embodiment shown in FIG. 9, a portion of the comparators C28 -C34 in fine ADC 530 are shown, including three redundant comparators C32-C34. Redundant comparators C32-C34 are identical to the other 31 comparators in sub-ADC 530. In this example, redundant comparators C32-C34 may result in a power consumption overhead of about 10%, but they may provide significant improvement, e.g., 2-3 dB, in the signal to noise and distortion ratio (SNDR). Redundant comparators C32-C34 may be digitally calibrated in the same fashion as the other 31 comparators in sub-ADC 530.

Redundant comparators C32-C34 detect errors. Redundant comparators C32 -C34 have negative references −2.5 LSB, −1.5 LSB and −0.5 LSB, indicating relative magnitudes that detect a value between 0 and −1 a value between −1 and −2 and a value between −2 and −3. The three additional comparators detect the first three levels in the forbidden zone (negative half plane). A larger or smaller range of erroneous values may be detected in other embodiments.

Detector 905 within logic 540 receives 34 bits from the 34 comparators in fine ADC 530. The 34 bits may represent a thermometer code. A one-to-zero transition in the thermometer code is commonly referred to as a top and denotes the digital level in the thermometer code that closely or most accurately represents the sampled input signal. These bits detect a range of values (i.e. a top) between −3 and 31.

Logic 540 maps detected values of −3, −2 and −1, respectively, to values of 0, 1 and 2. In other words, detected errors (input signal sample values detected in the wrong or forbidden half plan) are mapped to values in the correct half plan. Specifically, inputs to OR gate 906 are the values of −1 and 0, with the output being mapped to a value of 0. Inputs to OR gate 907 are the values of −2 and 1, with the output mapped to a value of 1. Inputs to OR gate 908 are the values of −3 and 2, with the output mapped to a value of 2. Additionally, inputs to OR gate 909 are the values of −3, −2 and −1, with the output indicating an error 910 when any of the redundant comparators C32-34 detect a value less than zero.

Detection of a value in the wrong half plan indicates an offset error that lead to an erroneous indication of the polarity of a sampled and held input signal. Thus, error 910 is input along with more significant bit(s) 516 to exclusive OR (XOR) gate 911. The output of XOR gate 911 is an error correction version of more significant bit(s) MSB out 912. Given the logic of XOR gate 911, if there is an error, then more significant bit(s) 516 will be flipped/inverted and output as MSB out 912. Error correction logic shown in FIG. 9 essentially reconstructs the transfer function of ADC 530 in the "dead-zone" region illustrated in FIG. 8. Accordingly, this error correction may be referred to as "deadzone" correction.

"Dead zone" correction logic may be applied to any two-step or pipelined ADC in order to increase the resolution, reduce the number of stages and/or to make other improvements in performance, area and power consumption. The number of comparators can be increased to improve the "dead zone" coverage, although the cost (extra power/area) and benefits (improved ENOB) should be analyzed and may vary between embodiments.

V. Error Avoidance Calibration

Figure 10:
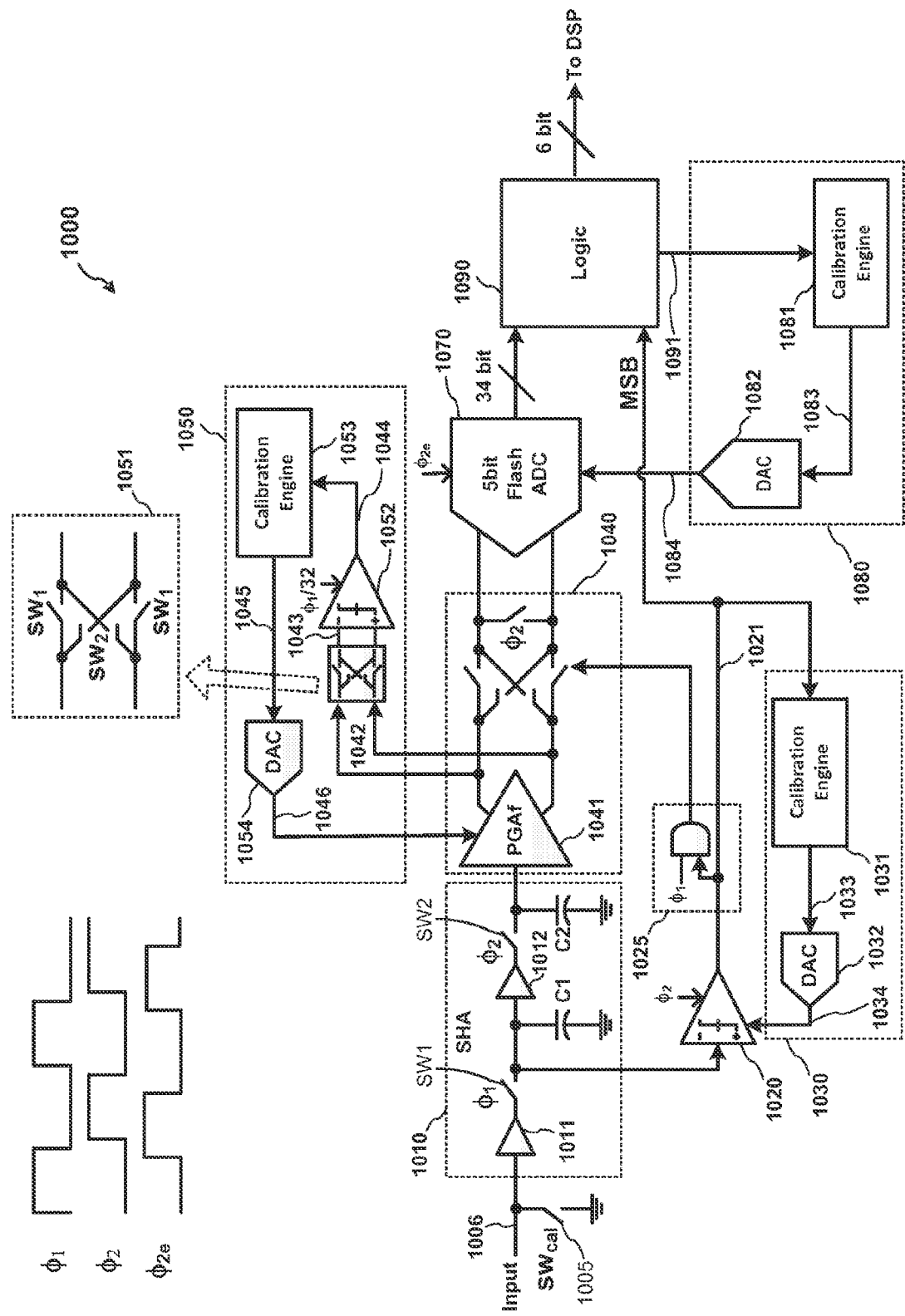
FIG. 10 shows a simplified block diagram of an exemplary embodiment of a multi-step folding ADC with error detection and correction by distributed offset calibration.
Figure 11:
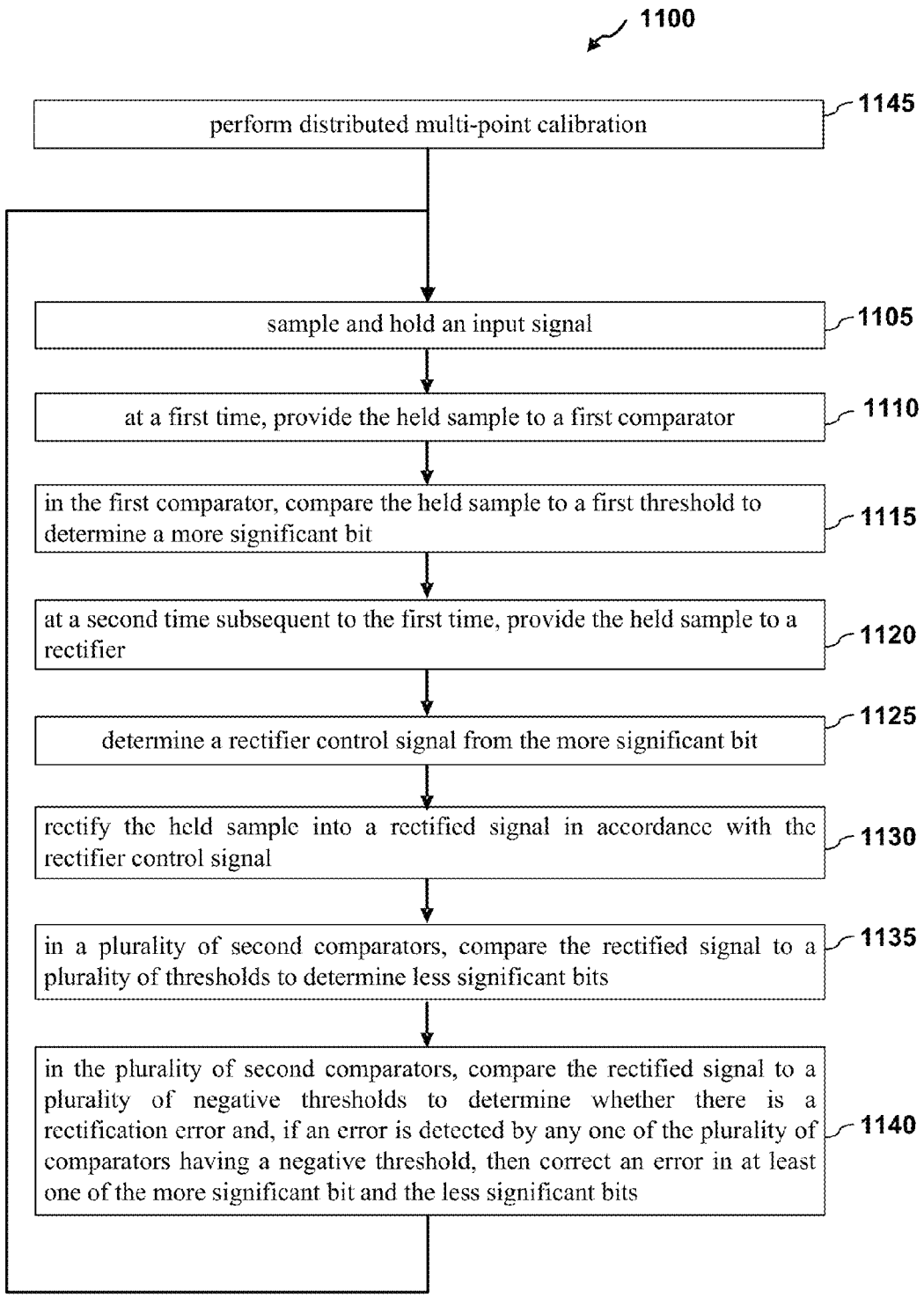
FIG. 11 shows a method of an exemplary embodiment of converting an analog signal into a digital signal.

To avoid errors and maintain a low BER in the two-step folding ADC and other topologies, digital offset calibration may be distributed at multiple points. For example, in some embodiments calibration may be performed at three separate locations, as shown in FIG. 10. Also, an enhanced binary search algorithm may be used to perform calibration, as shown in FIG. 11.

FIG. 10 shows a simplified block diagram of an exemplary embodiment of a multi-step folding ADC with error detection and correction by distributed offset calibration. FIG. 10 comprises two-step folding ADC 1000, where the first step comprises more significant bit detection by a coarse ADC and the second step comprises less significant bit detection by a half plan fine ADC. ADC 1000 comprises calibration switch 1005, SHA 1010, coarse comparator 1020, rectifier control circuit 1025, coarse calibration 1030, rectifier 1040 including PGA 1041, PGA calibration 1050, fine ADC 1070, fine calibration 1080 and logic 1090. ADC 1000 may comprise more or less components in other embodiments. For example, in one embodiment PGA 1041 may comprise a fine PGA and an additional PGA at the input may comprise a coarse PGA. Both PGAs may be calibrated dependently or independently.

Operation of and interaction between components SHA 1010, coarse comparator 1020, rectifier control circuit 1025, rectifier 1040 including PGA 1041, fine ADC 1070 and logic 1090 may be similar (or different), respectively, to operation of and interaction between SHA 505, coarse comparator 515, rectifier control logic 520, rectifier 525 including PGA 626, fine ADC 530 and logic 540.

One point of difference in this embodiment is the coupling between SHA 1010 and 1020. In this embodiment, the input to coarse comparator 1020 is not provided by a replicated sampling such as switch 510. In this embodiment, SHA 1010 is shown with first source follower 1011, first switch sw1, first capacitor c1, second source follower 1012, second switch sw2 and second capacitor c2. Embodiments of first and second source followers 1011, 1012 are shown in and discussed with regard to FIG. 6. First and second source followers 1011, 1012 provide input signal tracking. First and second switches sw1, sw2 may be similar to first and second SHA switches 609, 613. Operation of first and second switches sw1, sw2 and first and second capacitors c1, c2 provide sample and hold operations in stage one and stage two of SHA 1010. In this embodiment, the input to coarse comparator 1020 is coupled between first switch sw1 and first capacitor c1. Thus, coarse comparator 1020 operates in parallel with a first sample and hold stage of SHA 1010.

Generally, in the embodiment shown in FIG. 10, two-step folding ADC 1000 uses distributed or multi-point calibration. Specifically, in this embodiment, digital offset calibration is deployed at three specific locations: at PGA 1040; at coarse comparator 1020 and at fine ADC 1065. Calibration may be deployed at each of 34 comparators in fine ADC 1065. Points and components of calibration may vary between embodiments. Calibration may be dependent or independent of other calibration.

During calibration by coarse calibration 1030, PGA calibration 1050 and fine calibration 1080, calibration switch 1005 is closed, which couples input signal 1006 to ground.

Coarse calibration 1030 comprises coarse calibration engine 1031 and coarse calibration DAC 1032. Coarse calibration engine 1031 receives more significant bit(s) 1021, applies calibration logic that detects an offset and necessary correction, and generates DAC code 1033 to calibrate coarse comparator 1020. Coarse calibration DAC 1032 converts digital DAC code 1033 to analog coarse calibrated offset 1034. Coarse comparator 1020 receives coarse calibrated offset 1034, which calibrates the operation of coarse comparator 1020.

PGA calibration 1050 comprises PGA calibration chopper switches 1051, PGA calibration comparator 1052, PGA calibration engine 1053 and PGA calibration DAC 1054.

PGA calibration chopper switches 1051 receive as input PGA differential output 1042 and generate differential switch output 1043. During a calibration procedure, PGA calibration chopper switches 1051 may be controlled to block (open circuit), pass or reverse the polarity of PGA differential output 1042.

PGA calibration comparator 1052 receives differential switch output 1043 from PGA differential output 1042. Comparator outputs the difference of differential switch output 1043 and generates compared result 1044.

PGA calibration engine 1053 receives compared result 1044, applies calibration logic that detects offsets and necessary corrections, and generates DAC code 1045 to calibrate PGA 1041.

PGA calibration DAC 1054 converts digital DAC code 1045 to analog PGA calibrated offset 1046. PGA 1041 receives PGA calibrated offset 1046, which calibrates the operation of PGA 1041.

Fine calibration 1080 comprises fine calibration engine 1081 and fine calibration DAC 1082. Fine calibration engine 1081 receives input(s) 1091 from logic 1090, applies calibration logic that detects offsets and necessary corrections, and generates DAC codes 1083 to calibrate 34 comparators in fine ADC 1070. Fine calibration DAC 1082 converts digital DAC codes 1083 into 34 analog fine calibrated offsets 1084-1, 1084-2 . . . 1084-34. Each of 34 comparators in fine ADC 1070 receives a respective one of analog fine calibrated offsets 1084-1, 1084-2 . . . 1084-34, which calibrates the operation of the 34 comparators in fine ADC 1070.

Calibrating or trimming offsets at PGA 1040; at coarse comparator 1020 and at fine ADC 1065 provides strategic benefits. Trimming offsets at PGA 1040 enables trimming of SHA 1010 offset plus PGA 1041 offset. Trimming offsets at coarse comparator 1020 enables trimming of SHA 1010 offset plus coarse comparator 1020 offset. Trimming offsets at fine ADC 1070 (trimming each comparator in the fine ADC 1070) calibrates each offset of each comparator used in fine ADC 1070.

By de-correlating SHA 1010 offset and PGA 1041 offset from offsets of each comparator in fine ADC 1070, the size of ADC 1070 can be reduced by about 40%, thereby achieving a significant power/area reduction.

Digital calibration of coarse comparator 1020 enables minimization of offset at the inputs of both coarse comparator 1020 and fine ADC 1070. This reduces the "dead zone" in the transfer function of ADC 1000, thereby providing an improvement in the overall ENOB.

Digital offset calibration in some embodiments may be performed using an enhanced binary search algorithm that enables selection of an optimal code with the lowest quantization error. The distance to the threshold of the comparator is calculated at each step so the closest value to the optimal value is retained. In one embodiment of an enhanced binary search algorithm having n steps, at each step n of the binary search, calibration engine (e.g. 1031, 1053, 1081) generates and applies a DAC code (e.g. to 1032, 1054, 1082), receives the result (e.g. from 1021, 1044, 1091), calculates a sum, the sum being a distance to the threshold of the comparator), calculates a difference between the sum and a target or threshold value, and compares the computed difference to a difference calculated in a previous step. The threshold may be, for example, 32. The objective of calibration is to select the DAC code that results in lowest difference between the result and the target or threshold value to calibrate the calibrated component. This technique results in selecting the optimal value closest to the "zero crossing" threshold of the calibrated component in case there are differential nonlinearity (DNL) or integral nonlinearity (INL) errors in the calibration DAC.

As a detailed example, DAC control for n bits is initially set to 00000 . . . 00. An operation is repeated for each of the n bits, starting with the MSB. At step n, bit n is set to a value of 1. The output of the comparator is summed 64 times and a SUM value is computed. If SUM is greater than a threshold of 32 then bit n is set to a value of 1. If SUM is less than the threshold value of 32 then bit n is set to a value of 0 (zero). SUM(n)−32 is compared to SUM(n+1)−32. If the absolute value of SUM(n)−32 is less than the absolute value of SUM (n+1)−32 then the DAC control is stored. If the absolute value of SUM(n)−32 is greater than the absolute value of SUM(n+1)−32 then the previous DAC control is retained. This operation is repeated for each DAC control bit from bit n to bit 0. This guarantees that, during the calibration, if SUM−32 is calculated to be closer to 0 then the appropriate control value for the DAC will be retained.

Although PGA 1041 and SHA 1010 are being calibrated by trimming their combined offset, the calibration loop uses PGA calibration comparator 1052 to sense and amplify the offset error during calibration. The offset of PGA 1041 and HA 1010 may be calibrated by a technique that eliminates the offset of PGA calibration comparator 1052 and avoids an additional calibration engine to calibrate PGA calibration comparator 1052. In one embodiment, the combined offset of SHA 1010 and PGA 1041 is trimmed by a two-step procedure that removes the offset of PGA calibration comparator 1052. In the first step, the offset of PGA calibration comparator 1052 is added to the combined offset of SHA 1010 and PGA 1041. In the second step, the offset of PGA calibration comparator 1052 is subtracted from the combined offset of SHA 1010 and PGA 1041. Adding the results obtained in the first and second steps and dividing by two provides the combined offset of SHA 1010 and PGA 1041 without the offset of PGA calibration comparator 1052. The polarity of offset of PGA calibration comparator 1052 is inverted by operation of PGA calibration chopper switches 1051.

Error avoidance by distributed or multi-point digital offset calibration permits high speed, low BER performance with low power and area requirements. For example, compared to a conventional low BER 10 GS/s 6-bit ADC an embodiment of the described 10 GS/s 6-bit ADC consumes less than half the power with the same performance. Embodiments enable an increase from 6-bit to 7-bit resolution at the same or similar power and area consumption of traditional 6-bit ADCs.

Calibration techniques may be applied to a variety of ADC topologies. For example, to improve ENOB at higher clock frequencies in a pipeline topology without input signal rectification, distributed multi-point calibration may be applied to independently trim offsets.

Calibration techniques may vary between embodiments. For example, LSB size may vary among embodiments, optimized for various requirements such as power and area consumption. Calibration may occur prior to operation of high speed, low BER ADC 500 or may occur, e.g., periodically, during operation of high speed, low BER ADC 500. Calibration can be done in the foreground or in the background. In some embodiments, continuous background calibration of high speed, low BER ADC 500 may be performed by calibrating each of a plurality of high speed, low BER ADC 500 in ADC 100 before activation. Each of a plurality of high speed, low BER ADC 500 could be rotated between active and inactive status while maintaining continuous operation of each active high speed, low BER ADC 500. High speed, low BER ADC 500 rotated into inactive status may be calibrated or recalibrated before reactivation.

VI. Exemplary Method

Embodiments may also be implemented in processes or methods. Embodiments are described to achieve high speed, low BER performance with low power and area requirements compared to conventional ADCs. For example, FIG. 11 shows a method of an exemplary embodiment of converting an analog signal into a digital signal. Embodiments described with respect to FIGS. 1-10 and other embodiments in accordance with the technical subject matter described herein may operate according to method 1100.

Method 1100 for converting an analog signal into a digital signal comprises steps 1105 to 1145 shown in a loop. However, other embodiments may operate according to other methods. Other structural and operational embodiments will be apparent to persons skilled in the relevant art(s) based on the foregoing discussion of embodiments. No order of steps is required unless expressly indicated or inherently required. There is no requirement that a method embodiment implement all of the steps illustrated in FIG. 11. FIG. 11 is simply one of many possible embodiments. Embodiments may implement fewer, more or different steps.

Method 1100 begins with step 1105. In step 1105, an input signal is sampled and held. For example, as shown in FIGS. 1, 5, 6 and 10, an input signal may be sampled and held by SHA 105, SHA 505 or SHA 1010.

At step 1110, at a first time, the held sample of the input signal is provided to a first comparator. For example, as shown in FIGS. 5, 6 and 10, a sample is provided to coarse comparator 515 or coarse comparator 1020 through sampling switch 510 or first switch SW1 at a time set by first clock Φ1 shown in FIG. 7.

At step 1115, in the first comparator, the held sample is compared to a first threshold to determine a more significant bit. For example, as shown in FIGS. 5, 6 and 10, coarse comparator 515 or coarse comparator 1020 compare the held sample to a threshold to generate more significant bit(s) 516 or more significant bit(s) 1021.

At step 1120, at a second time subsequent to the first time, the held sample of the input signal is provided to a rectifier. For example, as shown in FIGS. 5, 6 and 10, the sampled signal is provided to rectifier 525 or rectifier 1040.

At step 1125, a rectifier control signal is determined from the more significant bit. For example, as shown in FIGS. 5, 6 and 10, rectifier control logic 520 or 1025 determines rectifier control signal 521 from more significant bit(s) 516.

At step 1130, the held sample is rectified into a rectified signal in accordance with the rectifier control signal. For example, as shown in FIGS. 5, 6 and 10, rectifier 525 or 1040 rectifies the held sample in accordance with rectifier control signal 521.

At step 1135, in a plurality of second comparators, the rectified signal is compared to a plurality of thresholds to determine less significant bits. For example, as shown in FIGS. 5, 6 and 10, a plurality of comparators in fine or sub-ADC 530 or 1070 compare rectified signal 526 to a plurality of thresholds to determine less significant bits 531.

At step 1140, in the plurality of second comparators, the rectified signal is compared to a plurality of negative thresholds to determine whether there is a rectification error and, if an error is detected by any one of the plurality of comparators having a negative threshold, then an error in at least one of the more significant bit and the less significant bits is corrected. For example, as shown in FIG. 9, three redundant comparators C32-34 compare rectified signal 526 to negative references −2.5 LSB, −1.5 LSB and −0.5 LSB. Further, OR gates 906-909 and XOR gate 911 in detector 905 within logic 540 detect and correct an error in at least one of more significant bit(s) 516 and less significant bits 531.

At step 1145, distributed multi-point calibration is performed. For example, as shown in FIGS. 5 and 10, digital offset DAC 545 or 1032 calibrates coarse comparator 515 or 1020, digital offset DAC 550 or 1082 calibrates each comparator in fine or sub-ADC 530 or 1070, and digital offset DAC 555 or 1054 calibrates PGA 626 or 1041 in rectifier 525 or 1040. Calibration may be performed independently or dependently at each point or location. Considering coarse comparator 515 or 1020 to be in a first path and rectifier 525 or 1040 to be in a second path, the first path may be calibrated independent of calibration of the second path. For example, this may comprise calibrating an offset of the coarse comparator 515 or 1020 independent of calibrating offsets of the plurality of second comparators in fine ADC 530 or 1070.

Calibration at one or more points or components (e.g. at each comparator or PGA) may use an enhanced binary search comprising, at each step in a plurality of steps of the enhanced binary search, determining a distance to a target or threshold for a respective component; and selecting a shortest distance of the calculated distances to calibrate an offset of the respective component.

Calibrating PGA 626 or 1041, or other amplifier, may require a comparator in the calibration loop. In one embodiment of the method, as explained with reference to FIG. 9, calibration may comprise shorting the amplifier inputs, closing a first set of chopper switches (e.g. PGA calibration chopper switches 1051) coupled to the amplifier output and determining a first offset value, closing a second set of chopper switches and determining a second offset value and determining a DAC calibration code for the amplifier from the first and second offset values.

In embodiments where a plurality of ADCs operate method 1100 as a plurality of channels, see, e.g., FIG. 1 ADCs 1-4, method 1100 may further comprise recovering data from the more significant bit and less significant bits and combining the recovered data with recovered data from at least one other channel operation of the method on the analog signal. In some embodiments, continuous background calibration may be performed by calibrating each of a plurality of ADCs, e.g., FIG. 1 ADCs 1-4 and possibly additional ADCs, before activation to perform method 1100 in one of a plurality of channels. Each of the plurality of ADCs is rotated between active and inactive status while maintaining continuous operation of the method in the plurality of channels. If there are four channels then more than four ADCs would permit continuous operation of four channels while inactive ADC(s) is(are) calibrated before being returned to active status.

VII. Conclusion

While various embodiments have been described above, it should be understood that they have been presented by way of example only, and not limitation. It will be understood by those skilled in the relevant art(s) that various changes in form and details may be made to such embodiments without departing from the spirit and scope of the subject matter of the present application.

Methods, systems, and apparatuses will now be described for a DSP receiver with an ADC having high speed, low BER performance with low power and area requirements. Speed is increased for multi-path ADC configurations by resolving a conventional bottleneck. ADC performance is improved by integrating calibration and error detection and correction, such as distributed offset calibration and redundant comparators. Power and area requirements are dramatically reduced by using low BER rectification to nearly halve the number of comparators in a conventional high speed, low BER flash ADC.

Advantages of embodiments include high speed, low BER performance with low power and area requirements. Speed is increased for multi-path ADC configurations by resolving a conventional bottleneck. By operating the coarse comparator in parallel with a hold stage to permit the comparator to start a conversion cycle before rectification, the comparator regeneration time bottleneck is removed and the ADC can operate at a higher clock frequency. BER performance is improved by integrating calibration and error detection and correction into the ADC, such as distributed or multi-point offset calibration and redundant comparators. Power and area requirements are dramatically reduced by using rectification to nearly halve the number of comparators in a conventional high speed, low BER flash ADC.

Embodiments are not limited to the functional blocks, detailed examples, steps, order or the entirety of subject matter presented in the figures, which is why the figures are referred to as exemplary embodiments. A device, apparatus or machine may comprise any one or more features described herein in any configuration. A method may comprise any process described herein, in any order, using any modality.

A device (i.e. apparatus), as defined herein, is a machine or manufacture as defined by 35 U.S.C. §101. Devices may be digital, analog or a combination thereof. Devices may be implemented with any semiconductor process or semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented by hardware (digital and/or analog) or a combination of hardware and software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A device comprising:
   a multi-path, rectifying analog-to-digital converter (ADC) converting an analog signal into a plurality of bits, the ADC comprising:
   a multi-stage signal hold circuit;
   a first path determining a first bit in the plurality of bits, the first path comprising:
   a first comparator generating the first bit, where the first comparator is configured to receive an analog signal at a first time; and
   a second path determining a second bit in the plurality of bits, the second path comprising:
   a rectifier, where the rectifier is configured to receive the analog signal at a second time after the first time; and
   a plurality of comparators coupled to an output of the rectifier, the plurality of comparators generating the second bit, wherein an input to the second path is coupled between stages in the multi-stage signal hold circuit.

2. The device of claim 1, wherein the multi-stage signal hold circuit operates in parallel with the first comparator in the first path, and wherein the rectifier is coupled to an output of the multi-stage signal hold circuit.

3. The device of claim 2, wherein the multi-stage signal hold circuit comprises one of a delay circuit, a sample-and-hold (SH) circuit and a track-and-hold (TH) circuit.

4. The device of claim 1, wherein the rectifier is controlled by the first bit.

5. The device of claim 1, wherein the first bit comprises a more significant bit and the second bit comprises a less significant bit.

6. The device of claim 1, the plurality of comparators in the second path comprising:
   at least one additional comparator configured to detect rectification errors.

7. The device of claim 6, wherein the at least one additional comparator is configured with a negative threshold.

8. The device of claim 7, the second path further comprising:
   a decoder configured to map an output of the at least one additional comparator to an output of a comparator in the plurality of comparators comprising a positive threshold.

9. The device of claim 1, wherein the first comparator comprises first offset calibrator and the plurality of comparators comprise a second offset calibrator, and wherein the first and second offset calibrators are configured to separately calibrate a first offset for the first comparator and a second offset for each comparator in the plurality of comparators.

10. The device of claim 9, the second path further comprising:
    an amplifier, wherein the rectifier is coupled to an output of the amplifier, and wherein the amplifier comprises a third offset calibrator configured to separately calibrate an offset for the amplifier.

11. The device of claim 10, wherein the third offset calibrator comprises:
    chopper switches having inputs coupled to outputs of the amplifier;

a comparator coupled to outputs of the chopper switches; and a calibrating digital to analog converter (DAC) coupled to an output of the comparator and having an output coupled to the amplifier.

12. A method of converting an analog signal into a digital signal comprising:
   at a first time, providing a held analog signal to a first comparator;
   in the first comparator, comparing the held analog signal to a first threshold to determine a more significant bit;
   at a second time subsequent to the first time, providing the held analog signal to a rectifier;
   determining a rectifier control signal from the more significant bit;
   rectifying the held analog signal into a rectified signal in accordance with the rectifier control signal;
   in a plurality of second comparators, comparing the rectified signal to a plurality of thresholds to determine less significant bits;
   in the plurality of second comparators, comparing the rectified signal to a plurality of negative thresholds to determine whether there is a rectification error; and
   if an error is detected by any one of the plurality of comparators having a negative threshold then correcting an error in at least one of the more significant bit and the less significant bits.

13. The method of claim 12, the first comparator being in a first path and the rectifier being in a second path, the method further comprising:
   calibrating the first path independent of calibrating the second path.

14. The method of claim 13, further comprising:
   calibrating an offset of the first comparator independent of calibrating offsets of the plurality of second comparators using an enhanced binary search comprising:
      at each step in a plurality of steps of the enhanced binary search for a respective comparator,
         determining a distance to a threshold for the respective comparator threshold; and
      selecting a shortest distance of the determined distances to calibrate an offset of the respective comparator.

15. The method of claim 13, the second path comprising an amplifier that amplifies the held signal, wherein calibrating the second path comprises calibrating an offset of the amplifier.

16. The method of claim 12, further comprising:
   recovering data from the more significant bit and less significant bits; and
   combining the recovered data with recovered data from at least one other channel operation of the method on the analog signal.

17. The method of claim 16, further comprising:
   performing continuous background calibration comprising:
      calibrating each of a plurality of analog-to-digital converters (ADCs) before activation to perform the method in one of a plurality of channels; and
      rotating each of the plurality of ADCs between active and inactive status while maintaining continuous operation of the method in the plurality of channels.

18. A device comprising:
   a multi-stage sample-and-hold (SH) circuit or track-and-hold (TH) circuit;
   a coarse comparator in parallel with the multi-stage SH or TH circuit;
   a rectifier in series with the multi-stage SH or TH circuit and controlled by an output of the coarse comparator;
   a fine analog-to-digital converter (ADC) with excess comparators to detect rectifier errors;
   a coarse comparator offset calibrator; and
   a fine ADC offset calibrator independent of the coarse comparator offset calibrator.

19. The device of claim 18, wherein the coarse comparator offset calibrator is configured to calibrate an offset of the coarse comparator using an enhanced binary search.

20. The device of claim 19, wherein the enhanced binary search comprises:
   at each step in a plurality of steps of the enhanced binary search,
      determining a distance to a threshold for the coarse comparator; and
      selecting a shortest distance of the determined distances to calibrate an offset of the coarse comparator.

* * * * *